United States Patent [19]
Park et al.

[11] Patent Number: 6,101,149
[45] Date of Patent: Aug. 8, 2000

[54] MEMORY MODULE HAVING MODULE CONTROL CIRCUIT

[75] Inventors: Young Gi Park; Ji Bum Kim, both of Cheongju, Rep. of Korea

[73] Assignee: LG Semicon Co., Ltd., Choongcheongbuk-Do, Rep. of Korea

[21] Appl. No.: 09/177,500

[22] Filed: Oct. 23, 1998

[30] Foreign Application Priority Data

Feb. 7, 1998 [KR] Rep. of Korea ......................... 98-3578

[51] Int. Cl.[7] ....................................................... G11C 8/00
[52] U.S. Cl. ................................. 365/230.06; 365/230.08
[58] Field of Search ........................... 395/425; 371/51.1; 365/63, 233, 230.06, 230.08, 233.5, 189.05

[56] References Cited

U.S. PATENT DOCUMENTS

5,283,877  2/1994  Gastinel et al. ........................ 395/425
5,319,591  6/1994  Takeda et al. ........................... 365/63
5,367,526  11/1994 Kong ...................................... 371/51.1
5,646,904  7/1997  Ohno et al. ............................. 365/233
5,912,860  6/1999  Schaefer ............................... 365/233.5

*Primary Examiner*—David Nelms
*Assistant Examiner*—Thong Le

[57] ABSTRACT

A memory module having a module control circuit which is capable of decreasing an operational current by configuring a 1BANK 4M×64 module using 16M DRAMs (1K Refresh× 16) and reducing the number of operational devices. The module control circuit decodes externally inputted eleventh and twelfth address signals and outputs control signals in accordance with one of a plurality of column address strobe signals and a row address strobe signal, and a plurality of DRAMs in a memory unit are selected by the control signals from the module control circuit and are parallely connected for performing a data write and read operation in accordance with externally inputted first through tenth address signals, a write enable signal, an output enable signal, and the column address strobe signals.

15 Claims, 8 Drawing Sheets

| INPUT | | OUTPUT | | | |
|---|---|---|---|---|---|
| A11 | A10 | iA0 | iA1 | iA2 | iA3 |
| LOW | LOW | HIGH | LOW | LOW | LOW |
| LOW | HIGH | LOW | HIGH | LOW | LOW |
| HIGH | LOW | LOW | LOW | HIGH | LOW |
| HIGH | HIGH | LOW | LOW | LOW | HIGH |

| INPUT | | OUTPUT |
|---|---|---|
| /RAS | iAi | iRASi |
| HIGH --> LOW | LOW | LOW |
| HIGH --> LOW | HIGH | HIGH |
| HIGH | DON'T CARE | HIGH |

FIG. 9

FIG. 10A  /RAS

FIG. 10B  ONE OF /CAS0~7

FIG. 10C  ND6

FIG. 10D  /RASk 
IRRESPECTIVE OF iRASi

FIG. 11A  /RAS

FIG. 11B  ONE OF /CAS0~7

FIG. 11C  ND6 
HIGH

FIG. 11D  /RASk 
VARIED BY iRASi

MEMORY MODULE HAVING MODULE CONTROL CIRCUIT

BACKGROUND OF THE INVENTION

1. Field of the Invention

The present invention relates to a memory module, and particularly to an improved memory module which is capable of decreasing an operational current by reducing the number of operational devices in the memory module.

2. Description of the Background Art

Figure 1:
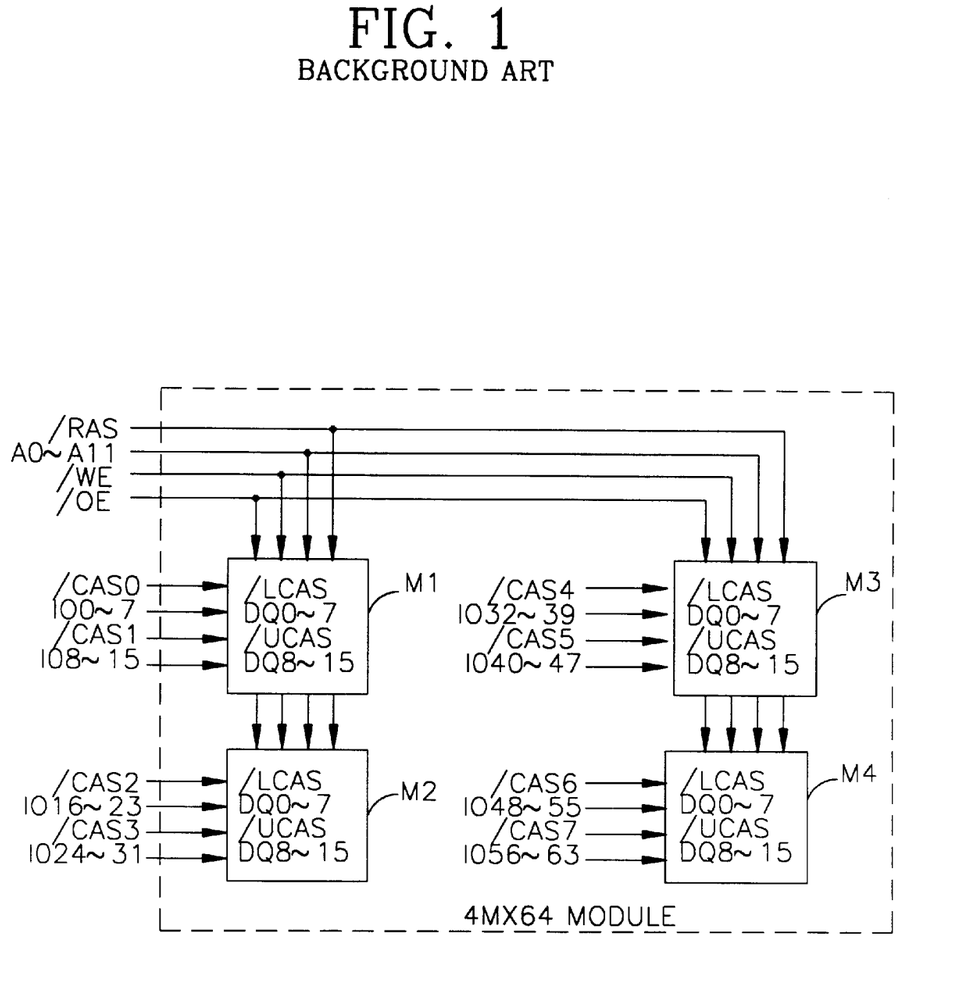
FIG. 1 is a schematic block diagram illustrating the organization of a first known memory module.

FIG. 1 illustrates a first known memory module which is configured as a 1 BANK 8CAS 4M×64 device provided with four 64M (4K Refresh×16) DRAMs (Dynamic Random Access Memories) M1 through M4 which receive various externally supplied control signals.

Figure 2:
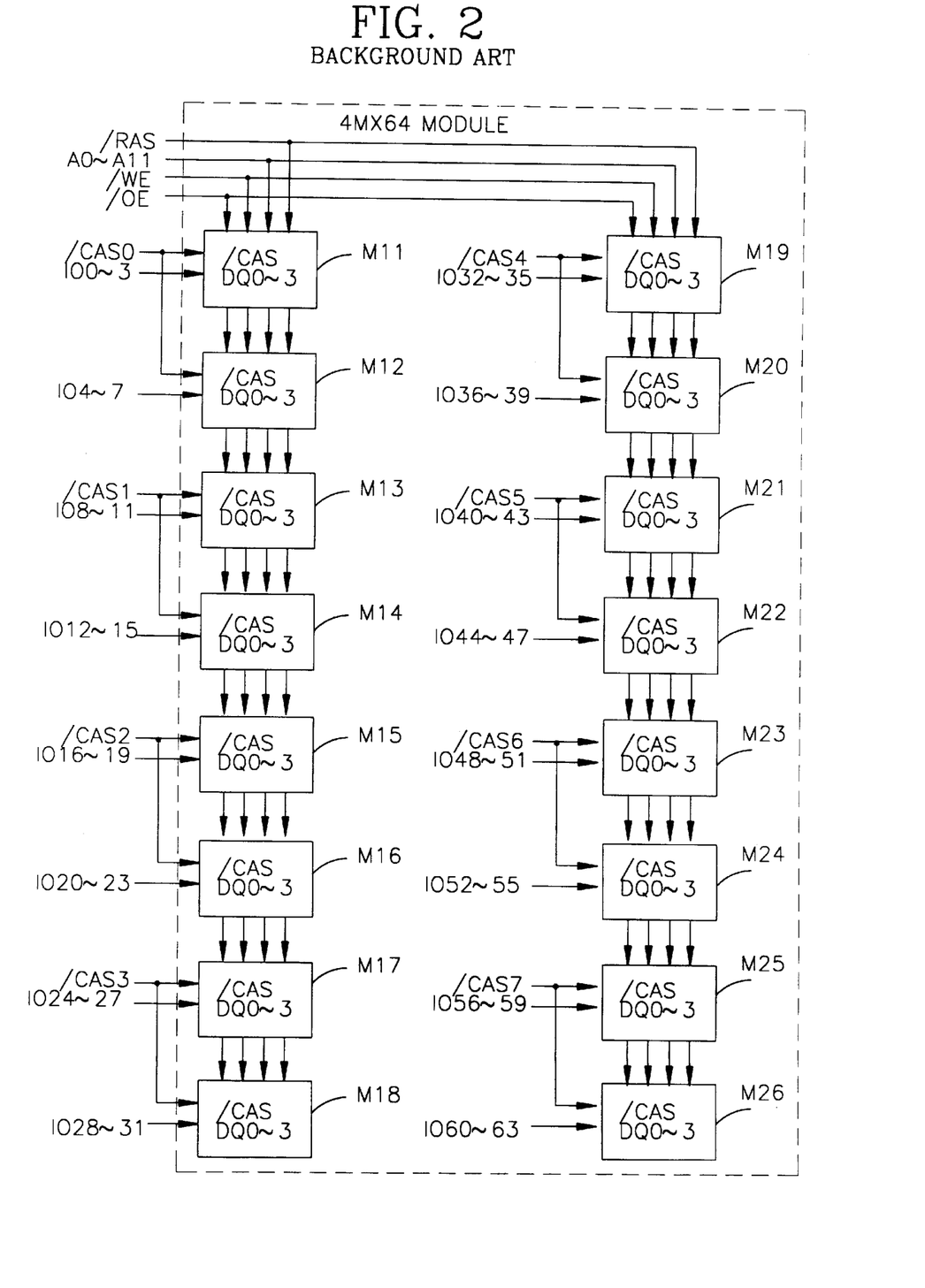
FIG. 2 is a schematic block diagram illustrating the organization of a second known memory module.

FIG. 2 illustrates a second known memory module which is configured as a 1 BANK 8CAS 4M×64 device provided with sixteen 16M (4K Refresh×4) DRAM M11 through M26 which receive various externally supplied control signals. In this regard, the above-described control signals denote a row address strobe signal /RAS, address signals A0 through A11, a write enable signal /WE, an output enable signal /OE, column address strobe signals /CAS0 through /CAS7, and data input/output signals IO0 through IO63.

The operations of the above-described first and second known memory modules will be explained with reference to the accompanying drawings.

First, as shown in FIG. 1, when the row address strobe signal /RAS is low level (active), four DRAMs M1 through M4 each receive address signals A0 through A11 and internally select an X-address signal.

The DRAMs M1 through M4 receive address signals A0 through A9 in accordance with column address strobe signals /CAOS through /CAS7 and internally select a Y-address signals. At this time, if the write enable signal /WE is low level (active), the DRAMs M1 through M4 perform a write operation in accordance with the data input/output signals IO0 through IO63, and if the output enable signal /OE is low level (active), the DRAMs M1 through M4 perform a read operation.

In addition, when the column strobe signals /CAS0 through /CAS7 first become low level (active) and are applied earlier than the row address strobe signals /RAS, the DRAMs M1 through M4 perform a refresh operation.

The second known memory module is operated similarly to the first known memory module. The 16M DRAMS M11 through M26 are concurrently operated in accordance with the row address strobe signal /RAS and column address strobe signals /CAS0 through /CAS7 which are externally applied. Accordingly, further detailed description thereof will be omitted.

Since the four 64M DRAMs which are employed as the first known memory module are more expensive than sixteen 16M DRAMs which are employed as the second memory module, in order to decrease the fabrication cost, sixteen 16M DRAMS are generally used for fabricating a 32M byte module.

When adapting the memory organization of the first known module for the second known module, only four 64 DRAMs are used in the first known art. However, in the second known module, sixteen 16M DRAMs are used and operated, so that the operational current is increased by about four times.

SUMMARY OF THE INVENTION

Accordingly, it is an object of the present invention to provide a memory module having a module control circuit which overcomes the aforementioned problems encountered in the background art.

It is another object of the present invention to provide a memory module having a module control circuit which is capable of decreasing an operational current by configuring a 1BANK 4M×64 module using 16M DRAMs (1K Refresh× 16) and reducing the number of operational devices.

To achieve the above objects, there is provided a memory module having a module control circuit for decoding externally inputted eleventh and twelfth address signals and outputting control signals in accordance with one of a plurality of column address strobe signals and a row address strobe signal, and a memory unit in which a plurality of DRAMs are selected by the control signals from the module control circuit and are parallely connected for performing a data write and read operation in accordance with externally inputted first through tenth address signals, a write enable signal, an output enable signal, and the plurality of column address strobe signals.

In the module control circuit according to the present invention, only four DRAMs among sixteen 16M DRAMs are operated at a time, so that it is possible to reduce the operational current by ¼.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 3:
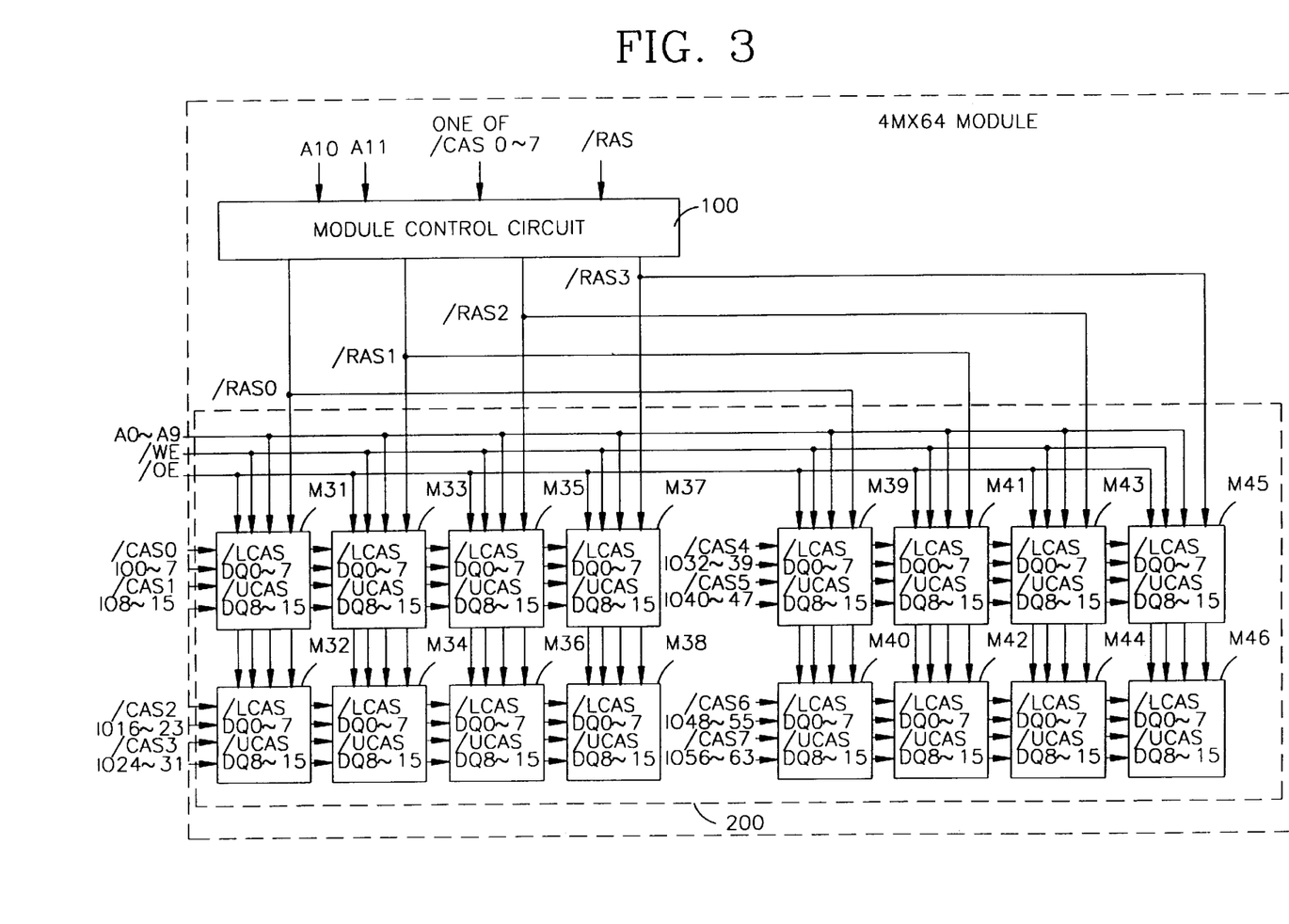
FIG. 3 is a schematic block diagram illustrating the organization of a memory module according to the present invention.

FIG. 3 illustrates a memory block in a memory module having a module control circuit according to the present invention.

As shown therein, a module control circuit 100 receives eleventh and twelfth address signals A10 and A11 and performs a decoding operation with respect thereto, and outputs control signals /RAS0 through /RAS3 in accordance with one signal among column address strobe signals /CAS0 through /CAS7 and a row address strobe signal /RAS.

A memory module unit 200 includes a plurality of parallely connected DRAMs M31 through M46 which are selected in accordance with control signals /RAS0 through /RAS3 from the module control circuit 100 and performs a write or read operation in accordance with externally inputted first through tenth address signals A0 through A9, a write enable signal /WE, an output enable signal /OE, and column address strobe signals /CAS0 through /CAS7.

Figure 4:
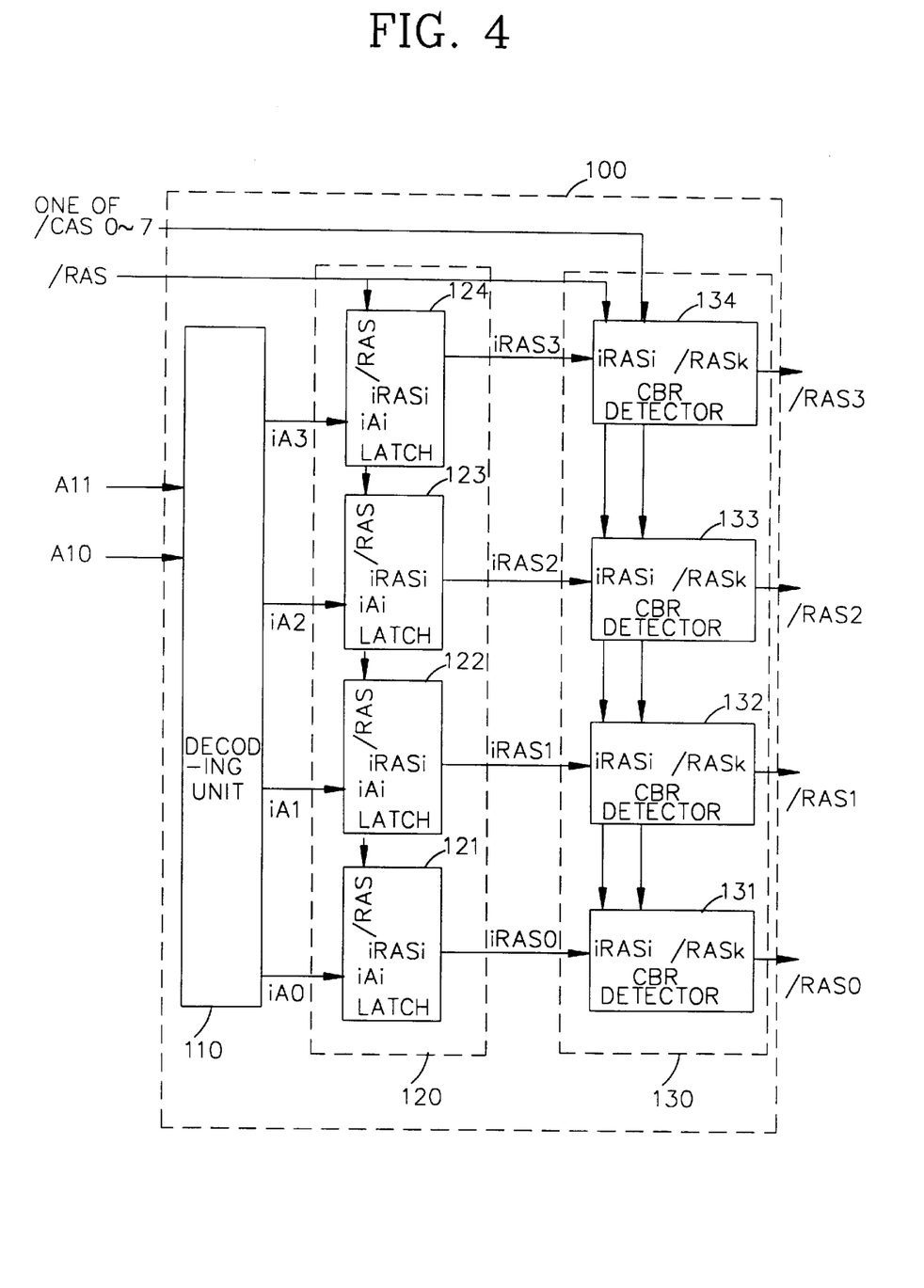
FIG. 4 is a schematic block diagram illustrating a module control circuit of the module in FIG. 3.

In addition, as shown in FIG. 4, the module control circuit 100 includes a decoding unit 110 decoding eleventh and twelfth address signals A10 and A11, a latch unit 120 for latching the output signals iA0 through iA3 from the decoding unit 110 in accordance with the row address strobe signal /RAS, and a CBR (Cas Before RAS) detector unit 130 receiving the output signals IRAS0 through IRAS3 from the latch unit 120 and detecting whether the thusly received signals are in a CBR state in accordance with one column address strobe signal selected from the column address strobe signals /CAS0 through /CAS7 and the row address strobe signal /RAS.

A CBR state denotes a state wherein the column address strobe signal /CAS is inputted before the row address strobe signal /RAS changes to an active low level signal. At this time, the memories perform a refresh operation.

Figure 5:
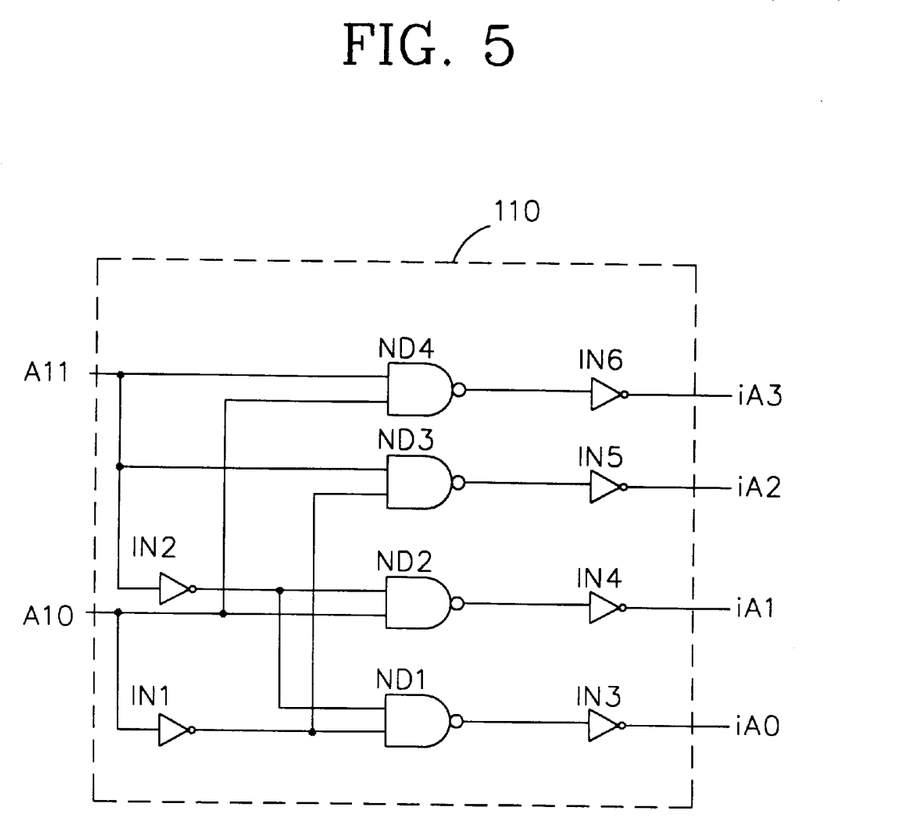
FIG. 5 is a schematic detailed circuit diagram illustrating a decoding unit in the circuit of FIG. 4.

As shown in FIG. 5, the decoding unit 110 includes a first NAND-gate ND1 NANDing the inverted eleventh and twelfth address signals /A10 and A11 which are respectively inverted by first and second inverters IN1 and IN2, a third inverter IN3 inverting the output signal of the NAND ND1 to output a first decoded address signal iA0, a second NAND-gate ND2 NANDing the eleventh address signals A10 and the inverted twelfth address signal /A11, a fourth inverter IN4 inverting the output signal of the NAND gate ND2 to output a second decoded address signal iA1, a third NAND-gate ND3 NANDing the inverted eleventh address signal /A10 and the twelfth address signal A11, a fifth inverter IN5 inverting the output signal of the NAND gate ND3 to output a third decoded address signal iA2, and a fourth NAND-gate ND4 NANDing the eleventh and twelfth address signals A10 and A11, and a sixth inverter IN6 inverting the output signal of the NAND gate ND4 to output a fourth decoded address signal iA3.

The latch unit 120 includes first through fourth latches 121 through 124 latching the output signals iA0 through iA3 from the decoding unit 110, and the CBR detector unit 130 includes first through fourth CBR detectors 131 through 134 which receive output signals iRAS0 through iRAS3 from the latch unit 120 and detect a CBR state in accordance with one signal among the column address strobe signals /CAS0 through /CAS7 and the row address strobe signal /RAS.

Figure 7:
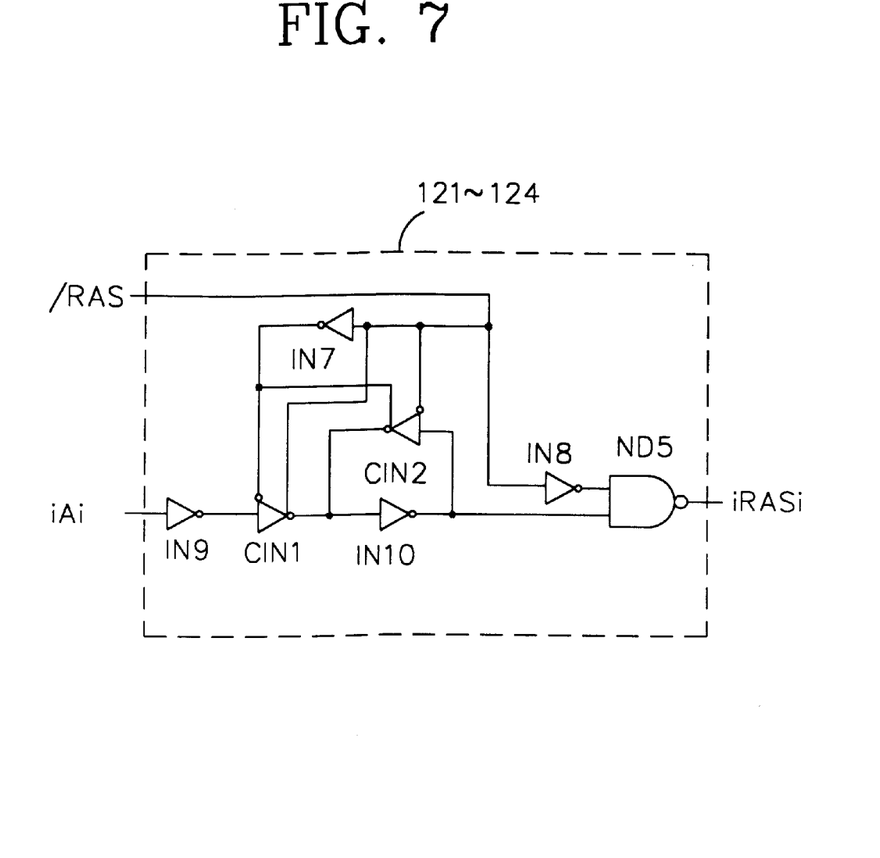
FIG. 7 is a detailed circuit diagram illustrating a latch unit in the circuit of FIG. 4.

As shown in FIG. 7, the first through fourth latches 121 through 124 each include seventh and eighth inverters IN7 and IN8 inverting the row address strobe signal /RAS, respectively, a ninth inverter IN9 inverting a corresponding one of the output signals iAi through iA3 from the decoding unit 10, a first clocked inverter CIN1 inverting the output signal from the ninth inverter IN9 synchronously with the row address strobe signal /RAS and the output signal from the seventh inverter IN7, a tenth inverter IN10 inverting the output signal from the first clocked inverter CIN1, a second clocked inverter CIN2 inverting the output signal from the tenth inverter IN10 and outputting a signal to the input of the tenth inverter IN10 synchronously with the row address strobe signal /RAS and the output signal from the seventh inverter IN7, and a fifth NAND-gate ND5 NANDing the output signals from the eighth inverter IN8 and the tenth inverter IN10 and outputting one of the latched signals iRASi (iRAS0 through iRAS3).

Figure 9:
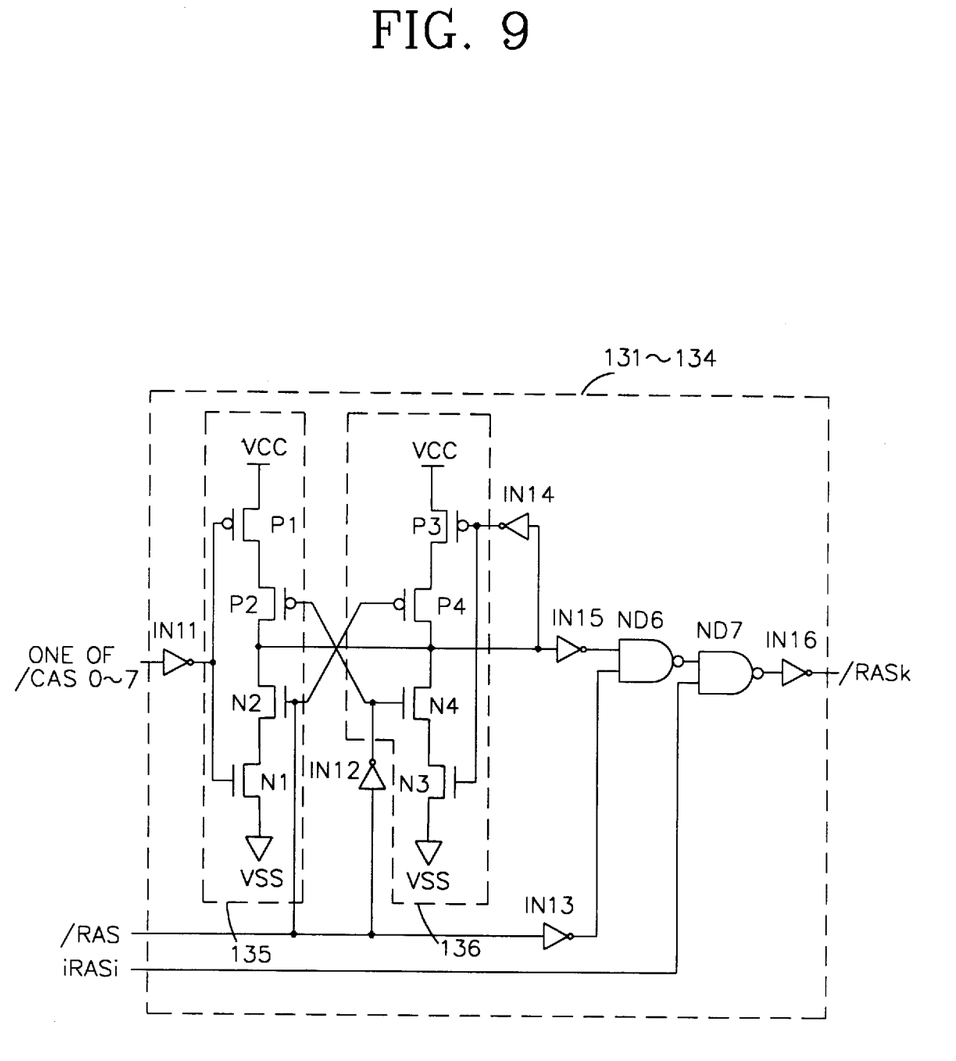
FIG. 9 is a schematic circuit diagram illustrating a CBR detector in the circuit of FIG. 4.

As shown in FIG. 9, the first through fourth CBR detectors 131 through 134 each include an eleventh inverter IN11 inverting one of the corresponding column address strobe signals /CAS0 through /CAS7, twelfth and thirteenth inverters IN12 and IN13 inverting the row address strobe signal /RAS, a first CMOS inverter circuit 135 inverting the output signal from the eleventh inverter IN11 in accordance with the row address strobe signal /RAS, fourteenth and fifteenth inverters IN14 and IN15 inverting the output signal from the first CMOS inverter circuit 135, a second CMOS inverter circuit 136 inverting the output signal from the fourteenth inverter IN14 in accordance with the row address strobe signal /RAS, a sixth NAND-gate ND6 NANDing the output signals from the thirteenth and fifteenth inverters IN13 and IN15, a seventh NAND-gate ND7 NANDing the output signal from the sixth NAND-gate ND6 and a corresponding one of the output signals iRASi from the latch unit 120, and a sixteenth inverter IN16 inverting an output signal of the NAND gate ND7 and outputting a corresponding control signal /RASK.

In the first CMOS inverter circuit 135, first and second PMOS transistors P1 and P2 and first and second NMOS transistors N1 and N2 are connected in series between a power supply voltage Vcc and ground, and the gates of the first PMOS transistor P1 and the first NMOS transistor N1 receive an output signal from the eleventh inverter IN11, respectively, and the gates of the second PMOS transistor P2 and the second NMOS transistor N2 respectively receive an output signal from the twelfth inverter IN12 and the row address strobe signal /RAS.

In the second CMOS inverter circuit 136, third and fourth PMOS transistors P3 and P4 and third and fourth NMOS transistors N3 and N4 are connected in series between the power supply voltage Vcc and ground, and the gates of the third PMOS transistor P3 and the third NMOS transistor N3 receive an output signal from the fourteenth inverter IN14, respectively, and the gates of the fourth PMOS transistor P4 and the fourth NMOS transistor N4 respectively receive the row address strobe signal /RAS and an output signal from the twelfth inverter IN12. The output terminals of the first and second CMOS inverter circuits 135 and 136 are connected with each other.

In addition, in the memory module unit 200, sixteen DRAMs M31 through M46 which are parallely connected are selected in accordance with the control signals /RAS0 through /RAS3 from the CBR detector unit 130 in the module control circuit 100. Here, four DRAMs are selected in accordance with each of the respective control signals /RAS0 thorough /RAS3. The DRAMs M31 through M46 are 16M DRAM (1K Refresh×16).

The operation of the memory module having a module control circuit according to the present invention will now be explained with reference to the accompanying drawings.

Figure 6:
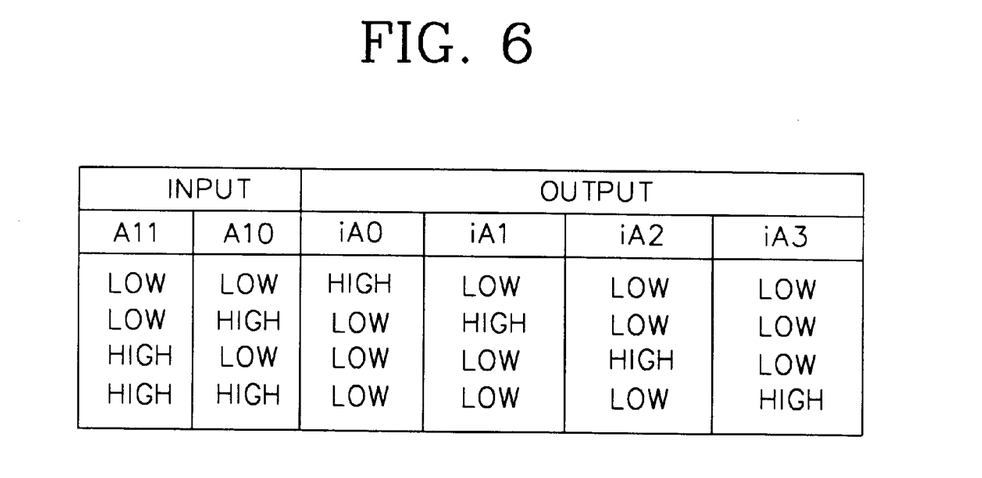
FIG. 6 is a table illustrating the interrelationship between input/output signals of the decoding unit of FIG. 5.

First, as shown in FIGS. 5 and 6, only one signal among the output signals iA0 through iA3 from the decoding unit 110 becomes high level at one time, and the remaining signals become low level in accordance with the eleventh and twelfth address signals A10 and A11. Namely, as shown in FIG. 6, if the eleventh and twelfth address signals A10 are both low level, only the output signal iA0 from the inverter IN3 become high level, and the remaining signals iA1 through iA3 become low level. Therefore, the decoding unit 110 decodes the externally inputted eleventh and twelfth address signals A10 and A11 for thereby increasing the available number of address signals which are conventionally lacking.

Figure 8:
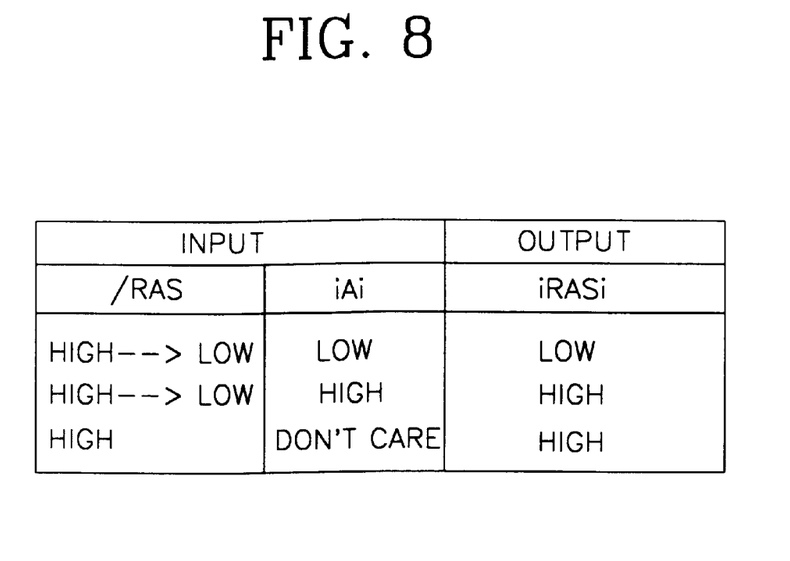
FIG. 8 is a table illustrating the interrelationship between input/output signals of the latch unit of FIG. 7.

In addition, as shown in FIGS. 7 and 8, the latches 121 through 124 in the latch unit 120 each output a high level output signal iRASi by the operations of the eighth inverter IN8 and the fifth NAND-gate ND5 therein when the row address strobe signal /RAS is high level irrespective of the signal iAi inputted from the corresponding decoding unit 110.

At this time, the output signal iAi from the decoding unit 110 is inverted by the ninth inverter IN9 and applied to the fifth NAND-gate ND5 through the first clocked inverter CIN1 which is turned on in accordance with a high level of the row address strobe signal /RAS and the tenth inverter IN10.

Thereafter, when the row address strobe signal /RAS is transited from a high level to a low level, the output signal from the tenth inverter IN10 is inputted into the fifth NAND-gate ND5 for thereby outputting the output signal iRASi, and the first clocked inverter CIN1 is turned off in accordance with the low level row address strobe signal /RAS and an output signal from the seventh inverter IN7, and the second clocked inverter CIN2 is turned on, and the latch unit 120 does not accept the output signal iAi inputted from the decoding unit 110 and instead latches the signal which was previously inputted.

In addition, when the row address strobe signal /RAS changes from a high level to a low level, when the respective output signal iAi from the decoding unit 110 is a high level, the output signals iRASi from the corresponding one of the first through fourth latches 121 through 124 become high level, and when the respective output signal iAi from the decoding unit 110 is a low level, the output signals iRASi from the corresponding one of the first through fourth latches 121 through 124 become low level.

The operation of the CBR detectors 131 through 134 of the CBR detector unit 130 will be explained with reference to the accompanying drawings.

First, as shown in FIGS. 10A through 10D and FIGS. 11A through 11D, when the row address strobe signal /RAS is a high level, since the output signal iRASi from the latch unit 120 is a high level, the output signal from the sixth NAND-gate ND6 becomes a high level irrespective of the level of the respective column address strobe signals /CAS0 through /CAS7, and the output signal from the sixth inverter IN16, namely, the output signals /RASk from the CBR detectors 131 through 134 become high level.

Figure 10A:
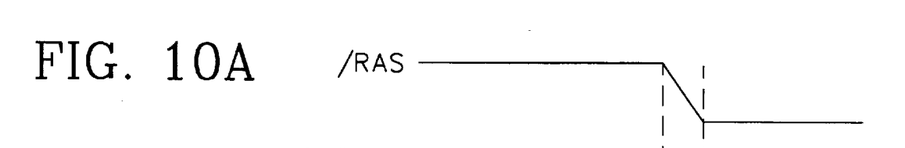
FIGS. 10A through 10D are waveform diagrams illustrating a signal timing in the CBR operation mode of the circuit of FIG. 4.
Figure 10B:
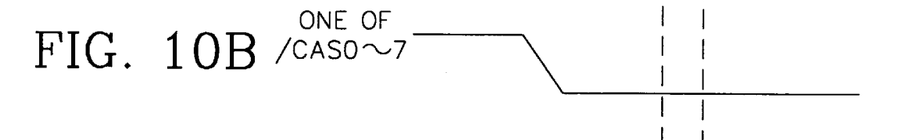
Figure 10C:
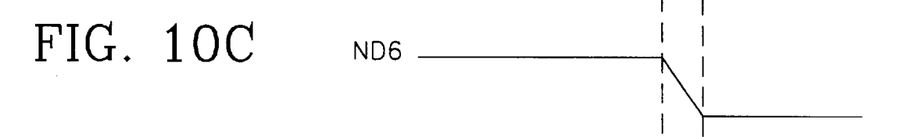
Figure 10D:
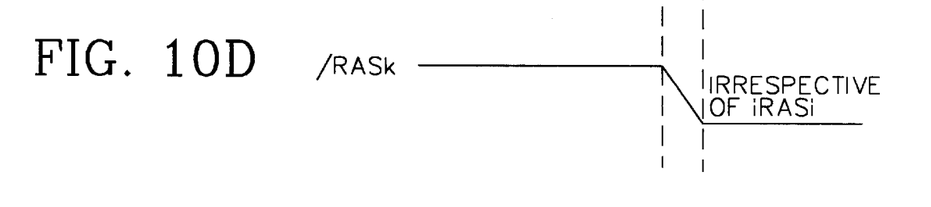
Figure 11A:
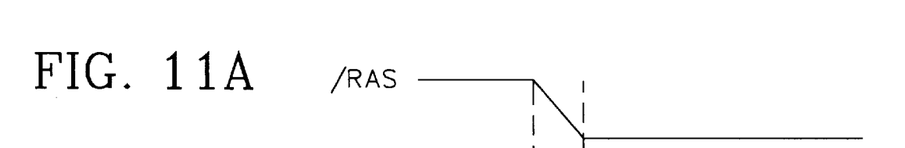
FIGS. 11A through 11D are waveform diagrams illustrating a signal timing in the normal operation mode of the circuit of FIG. 4.
Figure 11B:
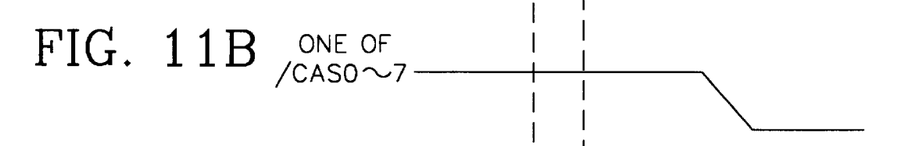
Figure 11C:
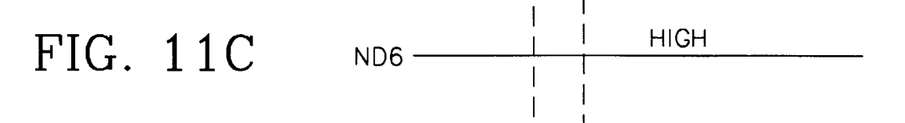

In addition, when the row address strobe signal /RAS is changed from a high level to a low level, the output signal from the sixth NAND-gate ND6 is changed as shown in FIGS. 10C and 11C in accordance with one signal of the row address strobe signal /RAS and the column address strobe signals /CAS0 through /CAS7, and the output signals /RASk from the CBR detectors 131 through 134 are changed in accordance with the output signals iRASi from the first through fourth latches 121 through 124 shown in FIG. 7.

In addition, when the row address strobe signal /RAS is changed from a high level to a low level and the operation mode is the CBR mode, namely, as shown in FIGS. 10A and 10B, when one signal among the column address signals /CAS0 through /CAS7 becomes a low level earlier than the row address strobe signal /RAS, as shown in FIG. 10C, the output signal from the sixth NAND-gate ND6 becomes a low level in accordance with the row address strobe signal /RAS, and the output signals /RASk from the CBR detectors 131 through 134 all become a low level irrespective of the output signals iRASi from the first through fourth latches 121 through 124.

Figure 11D:
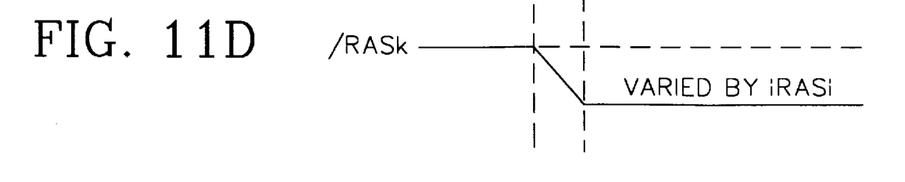

In addition, when the row address strobe signal /RAS is a low level, and the operation mode is the normal mode, namely, as shown in FIGS. 11A and 11B, when the row address strobe signal /RAS becomes a low level earlier than the column address signals /CAS0 through /CAS7, as shown in FIGS. 11C, the output signal from the sixth NAND-gate ND6 becomes a low level, and as shown in FIG. 11D, the output signals /RASk from the CBR detectors 131 through 134 all become low level, and when the output signals iRASi from the first through fourth latches 121 through 124 are high level, the output signals from the CBR detectors 131 through 134 become high level.

The operation of the module controller 100 will now be explained.

When the eleventh and twelfth address signals A10 and A11 are inputted from an address generator (not shown), the decoding unit 110 performs a decoding operation and outputs output signals iA0 through iA3, and as shown in FIG. 6, one signal among the output signals iA0 through iA3 from the decoding unit 110 becomes a high level in accordance with the eleventh and twelfth address signals A10 and A11, and the remaining three signals all become low level.

Thereafter, the output signals iA0 through iA3 from the decoding unit 110 are inputted into the corresponding first through fourth latches 121 through 124, and the output signals iRAS0 through iRAS3 from the first through fourth latches 121 through 124 all become high level when the row address strobe signal /RAS is a high level irrespective of the level of the output signals iA0 through iA3 from the decoding unit 110.

In addition, when the row address strobe signal /RAS becomes a low level, the output signals iRAS0 through iRAS3 from the first through fourth latches 121 through 124 are changed in accordance with the output signals iA0 through iA3 from the decoding unit 110. Namely, when the output signals iA0 through iA3 from the decoding unit 110 are high level, the corresponding output signals from the first through fourth latches 121 through 124 become high level, and when the output signals iA0 through iA3 from the decoding unit 110 become low level, the corresponding output signals iRAS0 through iRAS3 from the first through fourth latches 121 through 124 become low level.

The output signals iRAS0 through iRAS3 from the first through fourth latches 121 through 124 are inputted into the corresponding CBR detectors 131 through 134, and the CBR detectors 131 through 134 output the corresponding signals /RAS0 through /RAS3.

If the column address strobe signals /CAS0 through /CAS7 become low level earlier than the row address strobe signal /RAS, the output signals /RAS0 through /RAS3 from the CBR detectors 131 through 134 all become low level, and all the DRAMs M31 through M46 are selected. At this time, the memory module unit 200 performs a refresh operation.

In addition, if the row address strobe signal /RAS become low level earlier than the column address strobe signals /CAS0 through /CAS7, the CBR detectors 131 through 134 output one low level signal among the four output signals /RAS0 through /RAS3 and three high level signals in accordance with the output signals iRAS0 through iRAS3 from the first through fourth latches 121 through 124. At this time, in the memory module unit 200, only the (four) memories which are selected by the one low level signal perform a write or read operation in response to the externally inputted write enable signal /WE or output enable signal /OE.

Therefore, if the row address strobe signal /RAS becomes low level earlier than the column address strobe signals /CAS0 through /CAS7, namely, when the operation mode is the normal read/write mode, the module control circuit 100 outputs one low level signal among the four output signals /RAS0 through /RAS3 in accordance with the eleventh and twelfth address signals A10 and A11 inputted from the address generator (not shown) and outputs three high level signals for thereby selecting four DRAMs.

In addition, if the row address strobe signal /RAS becomes low level later than the column address strobe signals /CAS0 through /CAS7, namely, when the operation mode is the CBR mode, the module control circuit 100 outputs four low level output signals /RAS0 through /RAS3 irrespective of the eleventh and twelfth address signals A10 and A11 inputted from the address generator (not shown) and all the memories M31 through M46 are selected.

As described above, in the present invention, the memory module is configured with sixteen 16M DRAMs (1K Refresh×16), and there is provided a module control circuit for controlling the memory module, so that only four DRAMs among the sixteen 16M DRAMs are operated at a time under the control of the module control circuit, whereby it is possible to reduce the operational current by ¼.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. In a memory module in which a memory unit includes: a plurality of DRAMs which are selected by control signals from a module control circuit and are parallely connected for performing data write and read operation in accordance with externally inputted first through tenth address signals, a write enable signal, an output enable signal, and a plurality of column address strobe signals, the improvement wherein the module control circuit is capable of decoding externally inputted eleventh and twelfth address signals and outputting control signals in accordance with one of the plurality of column address strobe signals and a row address strobe signal.

2. The memory module of claim 1, wherein said module control circuit includes:
   a decoding unit for decoding the externally inputted eleventh and twelfth address signals;
   a latch unit for latching output signals from the decoding unit in accordance with the row address strobe signal; and
   a CBR (CAS Before RAS) detector unit for receiving output signals from the latch unit and the column address strobe signals and the row address strobe signal and outputting the control signals to the memory module.

3. The memory module of claim 2, wherein said decoding unit includes:
   a first NAND-gate for NANDing the eleventh and twelfth address signals inverted by first and second inverters and outputting the NANDed result to a third inverter;
   a second NAND-gate for NANDing the eleventh address signals and the inverted twelfth address signal and outputting the NANDed result to a fourth inverter;
   a third NAND-gate for NANDing the inverted eleventh address signal and the twelfth address signal and outputting the NANDed result to a fifth inverter; and
   a fourth NAND-gate for NANDing the eleventh and twelfth address signals and outputting the NANDed result to a sixth inverter.

4. The memory module of claim 2, wherein said latch unit includes first through fourth latches for latching output signals from the decoding unit in accordance with the inputted row address strobe signal.

5. The memory module of claim 4, wherein said first through fourth latches each include:
   seventh and eighth inverters for inverting the row address strobe signal, respectively;
   a ninth inverter for inverting an output signal from the decoding unit;
   a first clocked inverter for inverting an output signal from the ninth inverter, synchronously with the row address strobe signal and an output signal from the seventh inverter;
   a tenth inverter for inverting an output signal from the first clocked inverter;
   a second clocked inverter for inverting an output signal from the tenth inverter and outputting the thusly inverted signal to the tenth inverter as an input signal thereto, synchronously with the row address strobe signal and an output signal from the seventh inverter; and
   a fifth NAND-gate for NANDing respective output signals from the eighth inverter and the tenth inverter.

6. The memory module of claim 2, wherein said CBR detector unit includes first through fourth CBR detectors for outputting control signals to the memory unit in accordance with the row address strobe signal, and one of the plurality of column address strobe signals and output signals from the latch unit.

7. The memory module of claim 6, wherein said first through fourth CBR detectors each include:
   an eleventh inverter for inverting a corresponding one of the plurality of column address strobe signals;
   twelfth and thirteenth inverters for each inverting the row address strobe signal;
   a first inverting unit for inverting an output signal from the eleventh inverter in accordance with the row address strobe signal;
   fourteenth and fifteenth inverters for each inverting an output signal from the first inverting unit;
   a second inverting unit for inverting an output signal from the fourteenth inverter in accordance with the row address strobe signal;
   a sixth NAND-gate for NANDing output signals from the thirteenth and fifteenth inverters;
   a seventh NAND-gate for NANDing an output signal from the sixth NAND-gate and an output signal from the latch unit; and
   a sixteenth inverter for inverting an output signal of the seventh NAND gate for outputting a control signal to the memory unit.

8. The memory module of claim 7, wherein said first inverting unit includes first and second PMOS transistors and first and second NMOS transistors which are connected in series between a power supply voltage and a ground voltage, and wherein the gates of the first PMOS transistor and the first NMOS transistor receive an output signal from the eleventh inverter, and the gates of the second PMOS transistor and the second NMOS transistor receive an output signal from the eleventh inverter and the row address strobe signal, respectively.

9. The memory module of claim 7, wherein said second inverting unit includes third and fourth PMOS transistors and third and fourth NMOS transistors connected in series between a power supply voltage and a ground voltage, and wherein the gates of the third PMOS transistor and the third NMOS transistor receive an output signal from the fourteenth inverter, and the gates of the fourth PMOS transistor and the fourth NMOS transistor receive the row address strobe signal and an output signal from the twelfth inverter, respectively.

10. The memory module of claim 1, wherein said memory unit is provided with sixteen DRAMs which are parallely connected and selected by the control signals from the module control circuit, and wherein each of the DRAMs performs a data write or read operation in accordance with the externally inputted first through tenth address signals, the write enable signal, the output enable signal, and the plurality of column address strobe signals.

11. The memory module of claim 10, wherein said DRAMs are 16M DRAMs (1K Refresh×16).

12. The memory module of claim 10, wherein said DRAMs are selected in groups of four at a time in accordance with the control signals from the module control circuit.

13. The memory module of claim 10, wherein said DRAMs perform a refresh operation when the control signals from the module control circuit are all low level.

14. The memory module of claim 13, wherein when the control signals from the module control circuit are all low level, the row address strobe signal becomes a low level later than one of the plurality of column address strobe signals.

15. The memory module of claim 10, wherein in a normal read/write operation mode, one of said control signals from the module control circuit becomes low level in accordance with the eleventh and twelfth address signals.

* * * * *